(12) United States Patent
Sakai et al.

(10) Patent No.: US 11,616,155 B2
(45) Date of Patent: Mar. 28, 2023

(54) COVER GLASS FOR SOLAR CELL MODULE AND SOLAR CELL MODULE

(71) Applicants: AGC Inc., Chiyoda-ku (JP); AGC GLASS EUROPE, Louvain-la-Neuve (BE)

(72) Inventors: Tomohiro Sakai, Chiyoda-ku (JP); Tetsuji Irie, Chiyoda-ku (JP); Yu Onozaki, Chiyoda-ku (JP); Aichi Inoue, Chiyoda-ku (JP); Manabu Nishizawa, Chiyoda-ku (JP); Hiroyuki Yamamoto, Chiyoda-ku (JP)

(73) Assignees: AGC Inc., Chiyoda-ku (JP); AGC GLASS EUROPE, Louvain-la-Neuve (BE)

( * ) Notice: Subject to any disclaimer, the term of this patent is extended or adjusted under 35 U.S.C. 154(b) by 103 days.

(21) Appl. No.: 16/676,498

(22) Filed: Nov. 7, 2019

(65) Prior Publication Data
US 2020/0075787 A1 Mar. 5, 2020

Related U.S. Application Data

(63) Continuation of application No. PCT/JP2018/019791, filed on May 23, 2018.

(30) Foreign Application Priority Data

May 23, 2017 (JP) .............................. JP2017-101857

(51) Int. Cl.
*H01L 31/048* (2014.01)
*H01L 31/054* (2014.01)
(Continued)

(52) U.S. Cl.
CPC ........ *H01L 31/0481* (2013.01); *H01L 31/032* (2013.01); *H01L 31/0543* (2014.12); *H02S 20/26* (2014.12)

(58) Field of Classification Search
CPC .............. H01L 31/048; H01L 31/0488; H01L 31/0481; H01L 31/0543; H01L 31/0549;
(Continued)

(56) References Cited

U.S. PATENT DOCUMENTS 5,070,045 A 12/1991 Comte et al.
5,807,440 A * 9/1998 Kubota ................. H01L 31/048
136/256

(Continued)

FOREIGN PATENT DOCUMENTS

JP 60-188450 A 9/1985
JP 2007-123725 A 5/2007
(Continued)

OTHER PUBLICATIONS

JP-WO2014050004-A1 English machine translation (Year: 2016).*
International Search Report dated Aug. 14, 2018 in PCT/JP2018/019791 filed on May 23, 2018.

*Primary Examiner* — Andrew J Golden
(74) *Attorney, Agent, or Firm* — Oblon, McClelland, Maier & Neustadt, L.L.P.

(57) ABSTRACT

To provide a cover glass for a solar cell module which can sufficiently maintain the power generation efficiency of a solar cell module, even when a design is imparted to the entire surface of the cover glass so as to make solar cells be invisible from the outside, and a solar cell module.
To provide a cover glass 14 to be bonded on light-receiving surfaces 16A and 16B of solar cells 16 via an encapsulant material 18, which has a visible transmittance of from 0% to 60% and an average infrared transmittance of from 20% to 100%, which is a value calculated by simply averaging transmittances at 5 nm intervals in an infrared region at a wavelength of from 780 nm to 1,500 nm.

18 Claims, 2 Drawing Sheets

(51) Int. Cl.
   *H02S 20/26* (2014.01)
   *H01L 31/032* (2006.01)
(58) Field of Classification Search
   CPC ......... H01L 31/02167; H01L 31/02168; H01L 31/02165; H01L 31/054; H02S 40/22; H02S 30/00; H02S 20/26; H02S 20/22; C03C 4/10
   USPC ........................................................ 136/251
   See application file for complete search history.

(56) References Cited

U.S. PATENT DOCUMENTS

| | | | |
|---|---|---|---|
| 5,990,414 A * | 11/1999 | Posnansky | H01L 31/048 52/173.3 |
| 2006/0050513 A1 | 3/2006 | Brauneck et al. | |
| 2007/0290172 A1 | 12/2007 | Momose et al. | |
| 2009/0007960 A1 * | 1/2009 | Ito | H01L 31/1804 136/255 |
| 2009/0101192 A1 * | 4/2009 | Kothari | H01L 31/0543 136/246 |
| 2010/0069219 A1 | 3/2010 | Martin et al. | |
| 2010/0096011 A1 * | 4/2010 | Griffiths | H01L 31/02168 136/257 |
| 2010/0282318 A1 * | 11/2010 | Kalkanoglu | H01L 31/048 136/259 |
| 2010/0304948 A1 | 12/2010 | Comte et al. | |
| 2011/0017293 A1 * | 1/2011 | Farrell | H01L 31/048 136/259 |
| 2014/0141227 A1 | 5/2014 | Melscoët-Chauvel et al. | |
| 2015/0369433 A1 * | 12/2015 | Chen | G02B 5/1861 362/157 |
| 2016/0282716 A1 | 9/2016 | Lee et al. | |
| 2016/0304389 A1 | 10/2016 | Dogimont et al. | |
| 2017/0033250 A1 * | 2/2017 | Ballif | H01L 31/0481 |
| 2017/0090083 A1 | 3/2017 | Takishita et al. | |
| 2017/0298239 A1 * | 10/2017 | Yamanaka | H01L 31/049 |
| 2018/0030161 A1 | 2/2018 | Takishita et al. | |

FOREIGN PATENT DOCUMENTS

| | | | | |
|---|---|---|---|---|
| JP | 2012-033843 A | | 2/2012 | |
| JP | 2012-084820 A | | 4/2012 | |
| JP | WO2014050004 A1 * | | 8/2016 | ........... H01L 31/048 |
| WO | WO-2015091106 A1 * | | 6/2015 | ............. C03C 3/087 |
| WO | WO-2016052641 A1 * | | 4/2016 | ........... H01L 31/049 |
| WO | WO 2016/143824 A1 | | 9/2016 | |
| WO | WO 2017/089196 A1 | | 6/2017 | |

* cited by examiner

COVER GLASS FOR SOLAR CELL MODULE AND SOLAR CELL MODULE

TECHNICAL FIELD

The present invention relates to a cover glass for a solar cell module, and a solar cell module.

BACKGROUND ART

In recent years, demands for energy saving buildings are increasing, and a solar cell array is installed on the rooftop or the roof of a building in many cases. Particularly, it is important for zero emission buildings to secure the power generation amount, however, the energy consumption increases as the building becomes taller, whereas the area of the rooftop does not change. Accordingly, it is attempted to install a solar cell array also on a wall surface or windows in addition to the rooftop or the roof.

A solar cell array is constituted by a plurality of panel-form solar cell modules aligned in a plane and connected in series or in parallel.

Patent Document 1 discloses, as an example of a solar cell module, a solar cell module having a cover glass. This solar cell module comprises a solar cell circuit (corresponding to a solar cell) and a cover glass bonded to the circuit via an ethylene vinyl acetate resin film (corresponding to an encapsulant material).

Further, Patent Document 2 discloses, for the purpose of imparting a decorative display to a solar cell module, a solar cell module having a decorative design such as characters or figures color-printed on a substrate surface of a cover glass of the solar cell module.

Further, Patent Document 3 discloses, for the purpose of imparting color effects to a solar cell module, a graphic solar cell having a display pattern comprising a combination of dots, stripes, a check form or a pattern, and a patterned color, printed on a cover glass of a solar cell module.

PRIOR ART DOCUMENTS

Patent Documents

Patent Document 1: JP-A-2007-123725
Patent Document 2: JP-A-2012-84820
Patent Document 3: JP-A-2012-33843

DISCLOSURE OF INVENTION

Technical Problem

However, in the solar cell module in Patent Document 1, since the cover glass is transparent and has no design, solar cells are recognized through the cover glass. Thus, such a solar cell module having a cover glass which is transparent and has no design lowers the design on the wall of a building, and has no choice but to have a monotonous design.

On the other hand, in the solar cell modules in Patent Documents 2 and 3, a decorative design or a display pattern is printed on a part of the cover glass to impart the design. However, the solar cell modules in Patent Documents 2 and 3 had such drawbacks that the power generation efficiency significantly decreases if a decorative design or a display pattern is printed on the entire surface of the cover glass to make solar cells be invisible from the outside, that is, if a design is imparted to the entire surface of the cover glass.

Under these circumstances, it is an object of the present invention to provide a cover glass for a solar cell module which can sufficiently maintain the power generation efficiency of a solar cell module even if a design is imparted to the entire surface of the cover glass to make solar cells be invisible from the outside, and a solar cell module.

Solution to Problem

To achieve the above objects, the present invention provides a cover glass for a solar cell module to be bonded on a light-receiving surface of solar cells via an encapsulant material,
which has a visible transmittance of from 0% to 60%, and
an average infrared transmittance of from 20% to 100%, which is a value calculated by simply averaging transmittances at 5 nm intervals in an infrared region at a wavelength of from 780 to 1,500 nm.

"to" used to show the range of the numerical values is used to include the numerical values before and after it as the lower limit value and the upper limit value, and unless otherwise specified, the same applies hereinafter.

The cover glass for a solar cell module according to an embodiment of the present invention is preferably such that the reflected light has a dominant wavelength of from 380 to 780 nm or a complementary wavelength of from 490 to 570 nm, and an excitation purity of from 1% to 100%.

The cover glass for a solar cell module according to an embodiment of the present invention is preferably such that the reflected light has in the L*a*b* color space an L* value of from 5 to 100, an a* value of from −60 to 60, and a b* value of from −60 to 60.

The cover glass for a solar cell module according to an embodiment of the present invention preferably contains at least one element selected from the group consisting of Co, Mn, Fe, Ni, Cu, Cr, V, Zn, Bi, Er, Tm, Nd, Sm, Sn, Ce, Pr, Eu, Ag and Au.

The cover glass for a solar cell module according an embodiment of the present invention preferably comprises a glass plate and a coating layer, the coating layer being formed by applying a coating material containing at least one member selected from the group consisting of an organic pigment, a dye and an inorganic pigment to the front surface, the rear surface or both the surfaces of the glass plate.

The cover glass for a solar cell module according to an embodiment of the present invention is preferably such that it comprises a glass plate and a coating layer, and the ratio of the coating layer thickness to the glass plate thickness is from 0.001 to 1.0.

The cover glass for a solar cell module according to an embodiment of the present invention is preferably such that it comprises a glass plate and a coating layer, the glass plate has a refractive index of from 1.40 to 1.90, and the coating layer has a refractive index of from 1.30 to 1.80.

The cover glass for a solar cell module according to an embodiment of the present invention preferably scatters infrared light having a wavelength of from 780 nm to 1,500 nm.

The cover glass for a solar cell module according to an embodiment of the present invention is preferably formed of crystallized glass.

The cover glass for a solar cell module according to an embodiment of the present invention is preferably formed of phase-separated glass.

The present invention further provides a solar cell module comprising the cover glass for a solar cell module of the present invention, and solar cells, wherein the cover glass for a solar cell module is bonded to at least one light-receiving surface of the solar cells via an encapsulant material.

The solar cell module according an embodiment of the present invention is preferably such that the solar cells have a power generation peak in an infrared region at a wavelength of from 780 nm to 1,500 nm.

The solar cell module according an embodiment of the present invention preferably has a power generation peak in an infrared region at a wavelength of from 780 nm to 1,500 nm.

The solar cell module according an embodiment of the present invention is preferably such that the solar cells are monocrystalline silicon, polycrystalline silicon, GaAs, CIS, CIGS, CdTe, InP, Zn3P2 or Cu2S solar cells.

Advantageous Effects of Invention

According to the present invention, it is possible to provide a cover glass for a solar cell module, which can sufficiently maintain the power generation efficiency of a solar cell module even when a design is imparted to the entire surface of a cover glass so as to make solar cells be invisible from the outside, and a solar cell module.

DESCRIPTION OF EMBODIMENTS

Now, a preferred embodiment of a cover glass for a solar cell module and a solar cell module according to the present invention will be described with reference to FIGS. 1 and 2.

Figure 1:
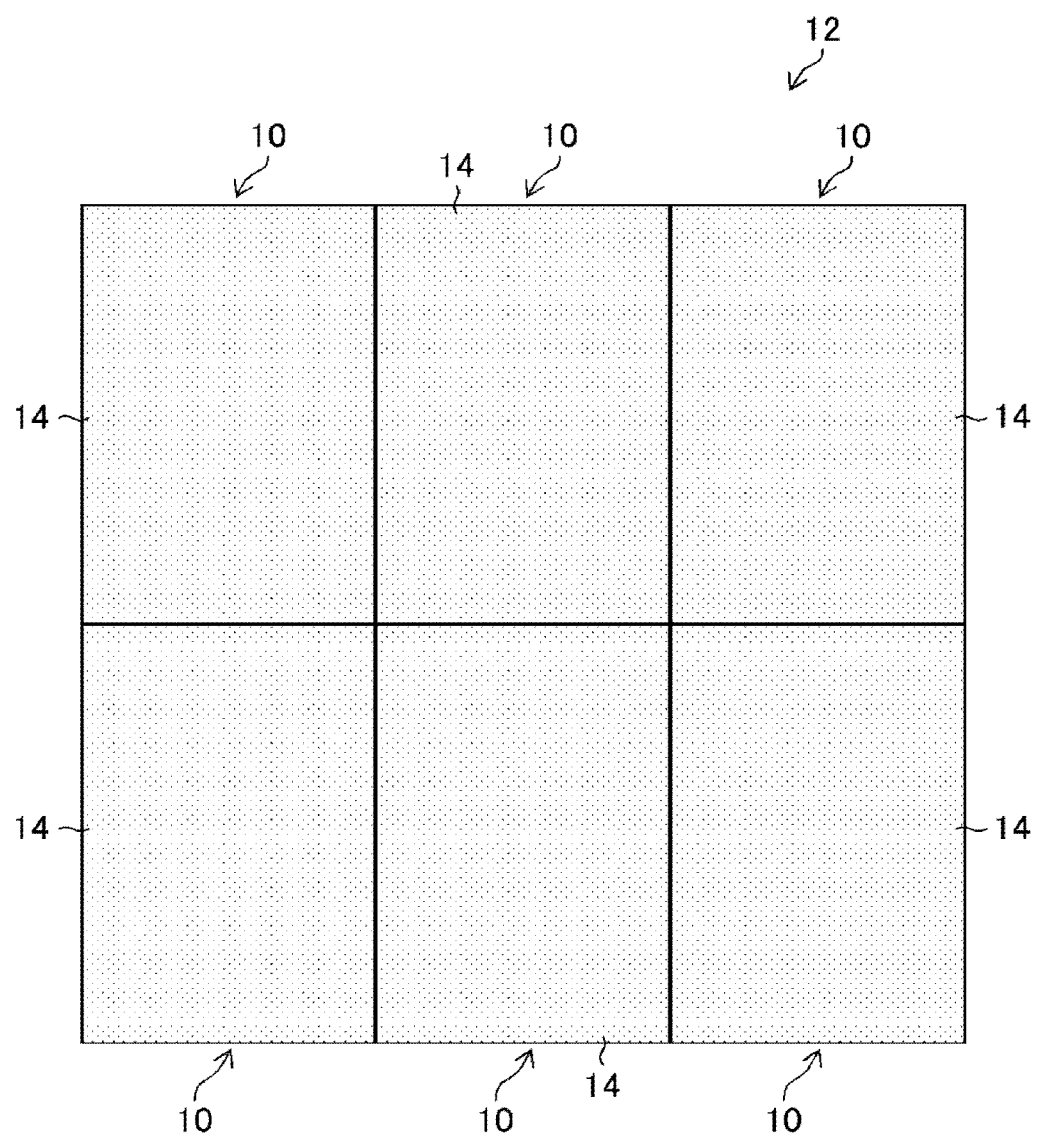
FIG. 1 is a plan view schematically illustrating a solar cell array constituted by solar cell modules according to an embodiment of the present invention.

FIG. 1 is a plan view schematically illustrating a solar cell array constituted by solar cell modules according to an embodiment of the present invention (hereinafter sometimes referred to as "the present solar cell modules").

In FIG. 1, a solar cell array 12 is constituted by a plurality of rectangular solar cell modules 10 aligned in a plane and connected in series-parallel in series or in parallel. The solar cell array 12 such constituted, which satisfies both the design and the power generation efficiency, is suitably installed on the rooftop or the roof of a building, and a wall surface or windows as well.

Figure 2:
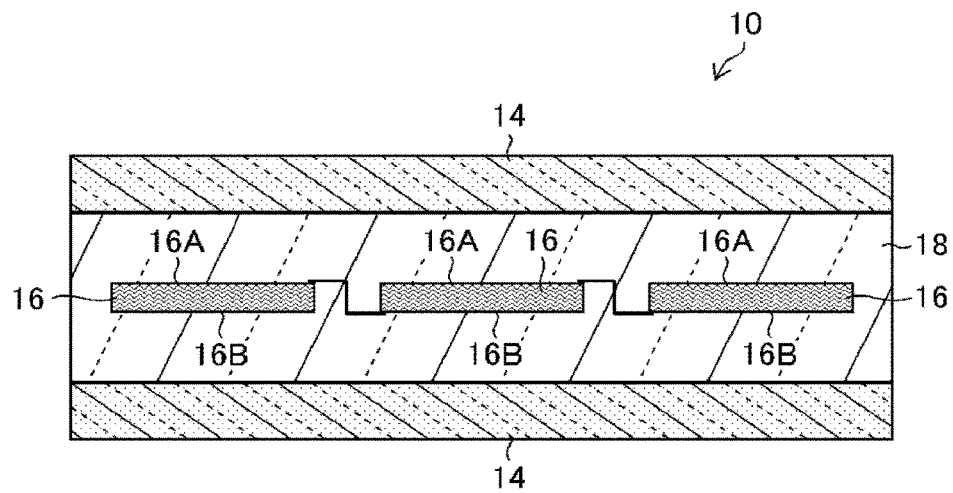
FIG. 2 is a cross-sectional view schematically illustrating a solar cell module comprising a cover glass for a solar cell module according to an embodiment of the present invention.

FIG. 2 is a cross-sectional view schematically illustrating a solar cell module comprising a cover glass for a solar cell module according to an embodiment of the present invention (hereinafter sometimes referred to as "the present cover glass").

In FIG. 2, a solar cell module 10 comprises a plurality of solar cells 16 and a cover glass 14 bonded to a light-receiving surface 16A on one side of the plurality of solar cells 16 via a transparent encapsulant material 18, and a cover glass 14 bonded to the other light-receiving surface 16B of the plurality of solar cells 16 via a transparent encapsulant material 18. FIG. 2 illustrates a solar cell module 10 employing the solar cells 16 which are double-sided light-receiving type solar cells, but the solar cell module is not limited thereto, and may be a solar cell module employing single-sided light-receiving type solar cells. A solar cell module employing single-sided light-receiving type solar cells is constituted by the present cover glass bonded to only one light-receiving surface of the solar cells via an encapsulant material.

The present cover glass is particularly characterized by the following essentialities.

That is, the present cover glass has a visible transmittance of from 0% to 60% in a visible region at a wavelength of from 380 nm to 780 nm, and has an average infrared transmittance of from 20% to 100%, which is a value calculated by simply averaging transmittances at 5 nm intervals in an infrared region at a wavelength of from 780 nm to 1,500 nm.

According to the present cover glass, which has a visible transmittance of at most 60%, it is possible to impart a design to the entire surface of the cover glass, and when the present cover glass is used in the present solar cell module, it is possible to make solar cells be invisible from the outside. The visible transmittance of the present cover glass is, in view of the design of the present cover glass, preferably from 0% to 50%, particularly preferably from 0% to 30%. More particularly, the visible transmittance of the present cover glass is, in view of the design of the present cover glass, preferably at most 60.0%, more preferably from 0% to 50.0%, particularly preferably from 0% to 30.0%.

Further, according to the present cover glass, which has an average infrared transmittance of at least 20%, the power generation efficiency of the present solar cell module having solar cells can be sufficiently maintained. The average infrared transmittance of the present cover glass is, in view of the power generation efficiency of the present solar cell module, preferably from 40% to 100%, particularly preferably from 60% to 100%. More particularly, the average infrared transmittance of the present cover glass is, in view of the power generation efficiency of the present solar cell modules, preferably at least 20.0%, more preferably from 40.0% to 100%, particularly preferably from 60.0% to 100%.

Accordingly, according to the present cover glass, and the present solar cell module comprising the present cover glass and solar cells, the power generation efficiency of the solar cell module can be sufficiently maintained even when a design is imparted to the entire surface of the cover glass so as to make the solar cells be invisible from the outside.

Now, an example of methods for calculating the visible transmittance and the average infrared transmittance of the present cover glass will be described.

First, the total transmittance of the cover glass is measured by using a spectrophotometer (manufactured by Hitachi High-Technologies Corporation, tradename: U-4100) at 5 nm intervals within a wavelength range of from 200 nm to 1,500 nm at a scanning rate of 1,200 nm/min.

For measurement, the cover glass as a sample is placed so that the surface is in contact with a light-receiving part of an integrating sphere, and a sample having a coating material applied thereto is set so that light enters from the glass plate side.

The visible region slit width is 8 mm, the light source switching wavelength is 340.0 nm, the Pbs sensitivity is 2, and the detector switching wavelength is 850.0 nm.

And, the visible transmittance employing illuminant A is calculated in accordance with JIS R3106: 1998. Further, the average infrared transmittance is calculated by simply averaging transmittances at 5 nm intervals in an infrared region at a wavelength of from 780 nm to 1,500 nm. By the above procedure, the visible transmittance and the average infrared transmittance can be calculated.

The visible transmittance and average infrared transmittance of the present cover glass may be uniform or may be distributed in a plane of the cover glass.

The present cover glass is preferably such that the reflected light has a dominant wavelength of from 380 nm to 780 nm or a complementary wavelength of from 490 nm to 570 nm, and an excitation purity of from 1% to 100%.

Further, the present cover glass is, in view of the design of the present cover glass, preferably a cover glass wherein the reflected light has the following combination of the dominant wavelength or complementary wavelength and the excitation purity.

A cover glass wherein the reflected light has a dominant wavelength of from 380 nm to 780 nm or a complementary wavelength of from 490 nm to 570 nm and an excitation purity of from 1% to 30%.

A cover glass wherein the reflected light has a dominant wavelength of from 380 nm to 490 nm and an excitation purity of from 30% to 100%.

A cover glass wherein the reflected light has a dominant wavelength of from 590 nm to 780 nm and an excitation purity of from 30% to 100%.

A cover glass wherein the reflected light has a dominant wavelength of from 550 nm to 590 nm and an excitation purity of from 30% to 100%.

Of the present cover glass, the dominant wavelength, the complementary wavelength and the excitation purity of the reflected light are calculated in accordance with JIS Z8701: 1999.

The present cover glass, which has a color represented by the color representation method in accordance with JIS Z8701: 1999, can be constituted as a non-transparent cover glass having a design imparted to the entire surface. By using the present cover glass having such a constitution for a solar cell module having solar cells, it is possible to make the solar cells be invisible from the outside. The color of the present cover glass can be defined by either of the dominant wavelength and the complementary wavelength, and particularly a purple color can be defined by the complementary wavelength.

The dominant wavelength, the complementary wavelength and the excitation purity of the reflected light from the present cover glass may be uniform or may be distributed in a plane of the cover glass depending upon the design imparted to the present cover glass.

The present cover glass is, in view of the design, preferably such that the reflected light has in the L*a*b* color space an L* value of from 5 to 100, an a* value of from −60 to 60 and a b* value of from −60 to 60.

By using the present cover glass for a solar cell module having solar cells, the L*, a* and b* values of the reflected light can be set as above, whereby the present cover glass can be constituted as a non-transparent cover glass, and it is thereby possible to make the solar cells be invisible from the outside.

The L*, a* and b* values of reflected light from the present cover glass may be uniform or may be distributed in a plane of the cover glass depending upon the design imparted to the present cover glass.

The present cover glass preferably scatters infrared light having a wavelength of from 780 nm to 1,500 nm, in view of the power generation amount and the power generation efficiency of the present solar cell module.

According to the present cover glass, an improvement of the power generation efficiency can be expected by suppressing a change of the power generation amount of the solar cells by the angle of incidence of sunlight and by prolongation of the optical path length of sunlight which passes through the power generation panel.

The surface of the present cover glass may be subjected to a roughening treatment so as to make the present cover glass scatter infrared light. The roughening treatment method may, for example, be a method of subjecting a glass plate to etching treatment with e.g. hydrofluoric acid, a method of polishing the glass plate surface, or a method of further forming a layer having irregularities on the surface of a glass plate or a coating layer e.g. by spray coating method.

The present cover glass scattering infrared light is defined, for example, as the present cover glass having an average infrared diffuse transmittance of form 5% to 100%. The average infrared diffuse transmittance of the present cover glass is preferably from 20% to 100%, more preferably from 20% to 65%, further preferably from 20% to 60%, particularly preferably from 45 to 60%. When the average infrared diffuse transmittance of the present cover glass is at least 5%, the optical path length of sunlight which passes through the power generation panel is prolonged, and the power generation efficiency of the solar cell module becomes high. When the average infrared diffuse transmittance of the present cover glass is at most 100%, light with a too small angle of incidence to the solar cells can be suppressed, and the power generation efficiency of the solar cell module becomes high.

Now, an example of the method for calculating the average infrared diffuse transmittance of the present cover glass is described below.

First, the linear transmittance of the cover glass is measured by using a spectrophotometer (manufactured by Hitachi High-Technologies Corporation, tradename: U-4100) at 5 nm intervals within a wavelength range of from 200 nm to 1,500 nm at a scanning rate of 1,200 nm/min.

The cover glass as a sample is disposed so that the plane is 340 mm distant from a light-receiving part of an integrating sphere, and a sample having a coating material applied thereto is set so that light enters from the glass plate side.

The visible region slit width is 8 mm, the light source switching wavelength is 340.0 nm, the Pbs sensitivity is 2 and the detector switching wavelength is 850.0 nm.

From the obtained linear transmittance, transmittances at the respective wavelengths are simply averaged to calculate an average linear infrared transmittance at a wavelength of from 780 nm to 1,500 nm, and from the average infrared transmittance at a wavelength of from 780 nm to 1,500 nm, the average linear infrared transmittance at a wavelength of from 780 nm to 1,500 nm is subtracted, and the obtained value is taken as the average infrared diffuse transmittance at a wavelength of from 780 nm to 1,500 nm.

Further, the present cover glass has, in view of the design of the present solar cell module, a visible reflectance of preferably from 5% to 100%. When the visible reflectance is at least 5%, the color of the cover glass can be visually recognized even when the cover glass is placed on the solar cells. Further, when the visible reflectance is at most 100%, the glare can be suppressed. The visible reflectance is preferably from 5% to 80%, more preferably from 20% to 80%.

Now, an example of the method for calculating the visible reflectance of the present cover glass is described below.

First, the total transmittance of the cover glass is measured by using a spectrophotometer (manufactured by Hitachi High-Technologies Corporation, tradename: U-4100) at 5 nm intervals within a wavelength range of from 200 nm to 1,500 nm at a scanning rate of 1,200 nm/min.

The cover glass as a sample is disposed so that the plane is in contact with a light-receiving part of an integrating sphere, and a sample having a coating material applied thereto is set so that light enters from the glass plate side.

The light source switching is automatic, the switching wavelength is 340.0 nm, the slit is fixed at 8 nm, and the sampling interval is 5 nm.

Further, there is no detector switching correction in the near infrared region, the detector switching wavelength is 850.0 nm, the scanning speed is 750 nm/min, the slit is automatically controlled, the Pbs sensitivity is 2, and the light control mode is fixed. And, the visible reflectance is calculated in accordance with JIS R3106: 1985. By the above procedure, the visible reflectance can be calculated.

The present cover glass may consist solely of a glass plate, or may comprise a glass plate, and a coating layer obtained by applying a coating material (hereinafter sometimes referred to simply as a "coating layer") on the front surface, the rear surface or both the surfaces of the glass plate. In a case where the cover glass of the present invention is a cover glass comprising a glass plate and a coating layer, the coating layer may cover the entire surface of the glass plate, or may cover only a part, and in view of the design, it preferably covers the entire surface of the glass plate.

The type of glass used for the glass plate in the present cover glass is not particularly limited, and may, for example, be soda lime glass, alkali-free glass or aluminosilicate glass.

Further, glass to be used for the glass plate in the present cover glass is preferably crystallized glass. In such a case, the present cover glass preferably consists of crystallized glass.

According to the present cover glass, by using crystallized glass having crystals in glass for the glass plate, light which is transmitted through the glass is diffused by the microfine structure in the glass and the transmittance can be lowered. Accordingly, it is possible to impart a design to the entire surface of the present cover glass thereby to make solar cells be invisible from the outside in the present solar cell module having solar cells. In the crystallized glass, crystalline phases having sizes of from several nm to several μm are distributed in the glass matrix, and the type and the size of crystals to be precipitated can be changed by selecting the composition of the matrix glass or by controlling production conditions or heat treatment conditions, whereby a desired non-transparent cover glass can be obtained. Further, the visible transmittance and the average infrared transmittance may be adjusted by controlling the amount and the size of crystalline phases precipitated in the matrix glass, and by whether the surface has irregularities by the polishing treatment conditions or the coating treatment. The visible transmittance tends to decrease when the amount of the crystalline phase is increased or the crystalline phases become large, and the visible transmittance tends to decrease also when the surface irregularities are significant.

Further, glass used for the glass plate in the present cover glass is preferably phase-separated glass. In such a case, the present cover glass preferably consists of phase-separated glass.

According to the cover glass of the present invention, by using phase-separated glass in which the glass has separate phases for the glass plate, light which is transmitted through the glass is diffused by the microfine structure in the glass and the visible light transmittance can be lowered. Accordingly, the present cover glass has a design imparted to the entire surface, and in the present solar cell module having solar cells, the solar cells can be made to be invisible from the outside. In the phase-separated glass, at least two glass phases differing in the composition are distributed. There is spinodal phase-separated glass in which the two phases are continuously distributed, and binodal phase-separated glass in which one phase is distributed in a particulate form in the matrix, and each phase has a size of at most 1 μm. According to the phase-separated glass, a desired non-transparent cover glass can be obtained by controlling the composition to achieve the appropriate phase-separated region and by heat treatment conditions under which phase-separation treatment is carried out. Further, by using the phase-separated glass, it is possible to impart patterns due to a difference in the glass composition thereby to improve the design.

Of the phase-separated glass, the visible transmittance and the average infrared transmittance may be adjusted by changing the proportions of the respective phases. For example, by increasing a proportion of glass having a composition with increased Cr, Co and Mn, the visible transmittance can be lowered without lowering the average infrared transmittance.

The glass plate in the present invention may be a glass plate having a treatment such as chemical tempering or physical tempering applied thereto (hereinafter sometimes referred to as a tempered glass plate) which is hardly broken as compared with a glass plate not having tempering treatment applied thereto. The tempered glass plate has a front layer and a rear layer each having residual compressive stress, and an interlayer having residual tensile stress formed between the front layer and the rear layer.

At the edge of the tempered glass plate, a layer having residual compressive stress may be present as continuous to the front layer and the rear layer. By the presence of a layer having residual compressive stress on the edge of the tempered glass plate, the tempered glass plate is hardly broken by an impact. The edge of the tempered glass plate may not be covered with a layer having residual compressive stress, and the edge of the interlayer may be exposed at the edge of the tempered glass plate. In such a case, the edge is preferably covered with a covering material such as a resin.

The tempering treatment to obtain a tempered glass plate may be either known chemical tempering treatment such as ion exchange method or known physical tempering treatment such as air-cooled tempering method. By the chemical tempering treatment, the residual compressive stress value of the front layer or the rear layer can be made high even when the tempered glass has a small plate thickness (at a level of 1 mm), and sufficient strength of a tempered glass plate can be secured. For example, the residual compressive stress value of each of the surface layer and the rear layer is preferably at least 300 MPa, more preferably at least 400 MPa. In a case of a chemically tempered glass plate, the thickness of each of the surface layer and the rear layer may be at most 50 μm, and may be at most 40 μm.

In a case where the glass plate in the present invention is a tempered glass plate, in view of easiness of chemical tempering, preferred is a tempered glass plate which is obtained by subjecting aluminosilicate glass containing at least 3% of $Al_2O_3$ as represented by mass % based on oxides, to chemical tempering treatment.

Further, the glass plate in the present invention may be a glass plate surface-treated by a known method.

Particularly in a case where the present cover glass is a cover glass comprising a glass plate and a coating layer, the adhesion between the glass plate and the coating layer improves when the glass plate is surface-treated.

The present cover glass is preferably colored entirely by elements contained in the glass plate.

According to the present cover glass, the entire surface of the cover glass is colored in a deep color with a design preferably by elements contained in the glass plate of the cover glass, and by the color, the solar cells 16 can be made to be invisible from the outside. As the coloring component element, for example, at least one member selected from the group consisting of Co, Mn, Fe, Ni, Cu, Cr, V, Zn, Bi, Er, Tm, Nd, Sm, Sn, Ce, Pr and Eu may be mentioned. Further, the glass plate may contain Ag or Au. By the coloring component element, the cover glass has absorption at a specific wavelength, and by properly adjusting the amount or the proportion of such an element, the visible transmittance and the average infrared transmittance may be adjusted. For example, by increasing Cr, Co or Mn, the visible transmittance can be lowered without lowering the average infrared transmittance.

Further, in a case where the present cover glass is a cover glass comprising a glass plate and a coating layer, the present cover glass is preferably colored by the coating layer. In such a case, the entire surface of the present cover glass is colored in a color with a design by the coating layer, and by the color, the solar cells can be made to be invisible from the outside.

The coating material may be any coating material which can form a coating layer by being applied to a glass plate and produce the present cover glass which is colored, and a known coating material may be used. The coating material is preferably a coating material containing at least one member selected from the group consisting of an organic pigment, a dye and an inorganic pigment.

The coating material may, for example, be an acrylic resin-based coating material, a melamine resin-based coating material or an epoxy resin-based coating material. Among them, an acrylic resin-based coating material is preferred, which has a strong adhesion, which is excellent in the weather resistance and the corrosion resistance, and which gives a beautiful finish. Further, coloring pigments with various colors may be used.

As the coating material, a polyester resin-based coating material, a urethane resin-based coating material, a fluorinated coating material or a silicone-based coating material may be properly used. Further, a glass frit dispersion having glass frit dispersed in a solvent may be used as a coating material.

The method of applying the coating material is not particularly limited and may, for example, be roll coating method, spray coating method, dip coating method, flow coating method, screen printing method, spin coating method or curtain coating method.

By changing the coating material used, the color of the coating material of the present cover glass may be adjusted, and the visible transmittance and the average infrared transmittance of the present cover glass may be adjusted. Particularly, the coating material contains as a coloring component at least one member selected from the group consisting of the above-described organic pigment, dye and inorganic pigment, and the type and amount may be properly adjusted so as to achieve the color to be imparted to the cover glass of the present invention and to achieve suitable visible transmittance and average infrared transmittance.

The inorganic pigment may, for example, be a composite oxide of chromium, titanium and antimony (orange), a composite oxide of iron, aluminum and titanium (orange), a composite oxide of nickel, titanium and antimony (yellow), a composite oxide of titanium, nickel and barium, a composite oxide of chromium and lead (yellow), a composite oxide of vanadium and bismuth (yellow), a composite oxide of nickel, cobalt, zinc and titanium (green), a composite oxide of cobalt, zinc and titanium (green), a composite oxide of zinc, nickel and titanium (brown), a composite oxide of manganese, antimony and titanium (brown), a composite oxide of aluminum and cobalt (blue), a composite oxide of cobalt, iron and chromium (black), iron oxide (red) or lithium cobalt phosphate (purple). The inorganic pigment may be surface-treated with an inorganic compound or an organic compound.

The organic pigment may, for example, be an azo pigment or a polycyclic pigment, specifically, an oxazin pigment (purple), a phthalocyanine pigment (brown), a benzimidazolone pigment (brown), a benzimidazolone pigment (brown), an isoindolinone pigment (yellow) or a quinacridone pigment (red).

The dye may, for example, be a diarylmethane type, a triarylmethane type, a thiazole type, a methine type such as merocyanine or pyrazolone methine, an azomethine type such as indoaniline, acetophenoneazomethine, pyrazole azomethine, imidazole azomethine or pyridone azomethine, a xanthene type, an oxazin type, a cyanomethylene type such as dicyanostyrene or tricyanostyrene, a thiazine type, an azine type, an acridine type, a benzeneazo type, an azo type such as pyridone azo, thiophene azo, isothiazole azo, pyrrole azo, pyral azo, imidazole azo, thiadiazole azo, triazole azo or disazo, a spiropyran type, an indolinospiropyran type, a fluoran type, a rhodamine lactam type, a naphthoquinone type, an anthraquinone type or a quinophthalone type.

Two or more types of the above coloring component may be contained.

The content ratio of the coloring component to the total mass of the coating material and the content ratio of the coloring components to the total mass of the coating layer are not particularly limited and may be properly set so as to achieve the high design of the present invention, depending upon the type of the coloring component used.

In a case where the present cover glass is a cover glass comprising a glass plate and a coating layer, the ratio of the coating layer thickness to the glass plate thickness (layer thickness/plate thickness) is preferably from 0.001 to 1.0, more preferably from 0.005 to 0.500, particularly preferably from 0.010 to 0.020. Within such a range, the visible transmittance and the average infrared transmittance of the present cover glass can be particularly suitably adjusted.

In a case where the present cover glass is a cover glass comprising a glass plate and a coating layer, the coating layer thickness is preferably from 5 µm to 2,000 µm, more preferably from 10 µm to 1,000 µm, particularly preferably from 20 µm to 100 µm. Further, in a case where the present cover glass is a cover glass comprising a glass plate and a coating layer, the glass plate thickness is preferably from 0.7 mm to 9.7 mm, particularly preferably from 2.0 mm to 6.0 mm. Within such a range, the design and the power generation efficiency of the present solar cell module are well balanced.

In a case where the present cover glass is a cover glass comprising a glass plate and a coating layer, the refractive index of the coating layer is preferably from 1.30 to 1.80, particularly preferably from 1.40 to 1.65. The refractive index of the coating layer may be properly adjusted by incorporating at least one member selected from the group consisting of an organic pigment, a dye and an inorganic pigment in the coating layer. Further, it can be adjusted also by selecting a coating material capable of forming a coating layer having a refractive index within the above range. In such a case, the coating material is suitably a fluorinated coating material, a silicone-based coating material or a glass frit dispersion having glass frit dispersed in a solvent.

Further, the refractive index of the glass plate in the present invention is from 1.40 to 1.90, preferably from 1.45 to 1.60. In such a case, the glass plate is suitably soda lime glass.

The smaller the difference in the refractive index between the glass plate and the coating layer, the more excellent the power generation efficiency of the present solar cell module, and the larger the difference in the refractive index between the glass plate and the coating layer, the more excellent the design of the present solar cell module. Accordingly, in view of the balance between the power generation efficiency and the design of the present solar cell module, it is preferred that the refractive index of the glass plate is from 1.40 to 1.90 and the refractive index of the coating layer is from 1.30 to 1.80, and it is more preferred that the refractive index of the glass plate is from 1.45 to 1.60 and the refractive index of the coating layer is from 1.40 to 1.65.

The refractive index of the glass plate may be measured by V-block method using a precision refractometer (KPR-3000, trade name, manufactured by Shimadzu Corporation).

The refractive index of the coating layer may be measured by using a reflectance spectral thickness meter (FE-3000, trade name, manufactured by Otsuka Electronics Co., Ltd.).

The present cover glass may be produced by a known method. That is, it is produced by cutting a glass plate formed into a ribbon e.g. by float process, fusion process, down draw process or roll out process, into a rectangle. In a case where a chemically tempered or surface treated glass plate is used for the present cover glass, the tempering treatment or the surface-treatment on the glass plate may be conducted at an optional timing. Further, in a case where the present cover glass is a cover glass comprising a glass plate and a coating layer, a coating material is applied to a glass plate at an optional timing by a known application method, and as the case requires, drying or heating, sintering or the like is applied to form a coating layer.

The present cover glass preferably has a thickness of from 1 mm to 10 mm. When the present cover glass has a thickness of at least 1 mm, it has high durability and is hardly broken. The thickness is more preferably at least 2 mm, further preferably at least 3 mm, particularly preferably at least 4 mm. Further, when the present cover glass has a thickness of at most 10 mm, it is light in weight. The thickness is more preferably at most 8 mm, further preferably at most 6 mm.

The thickness of the present cover glass is, in a case where the present cover glass consists of a glass plate, the glass plate thickness, and in a case where the present cover glass comprises a glass plate and a coating layer, the total of the glass plate thickness and the coating layer thickness.

The encapsulant material in the present invention has a role to encapsulate the solar cells. The material and the thickness of the encapsulant material may be properly selected from known materials and optional thicknesses so that the encapsulant material has favorable gas barrier properties and the encapsulant material can follow protrusions and recesses of the solar cells to be encapsulated in the encapsulant material.

Each solar cell in the present solar cell module has a power generation peak preferably in an infrared region at a wavelength of from 780 nm to 1,500 nm. Further, the present solar cell module has a power generation peak preferably in an infrared region at a wavelength of from 780 nm to 1,500 nm. The power generation peak being within the above wavelength range means that there is at least one peak top of the power generation peak present within the above wavelength range.

Figure 3:
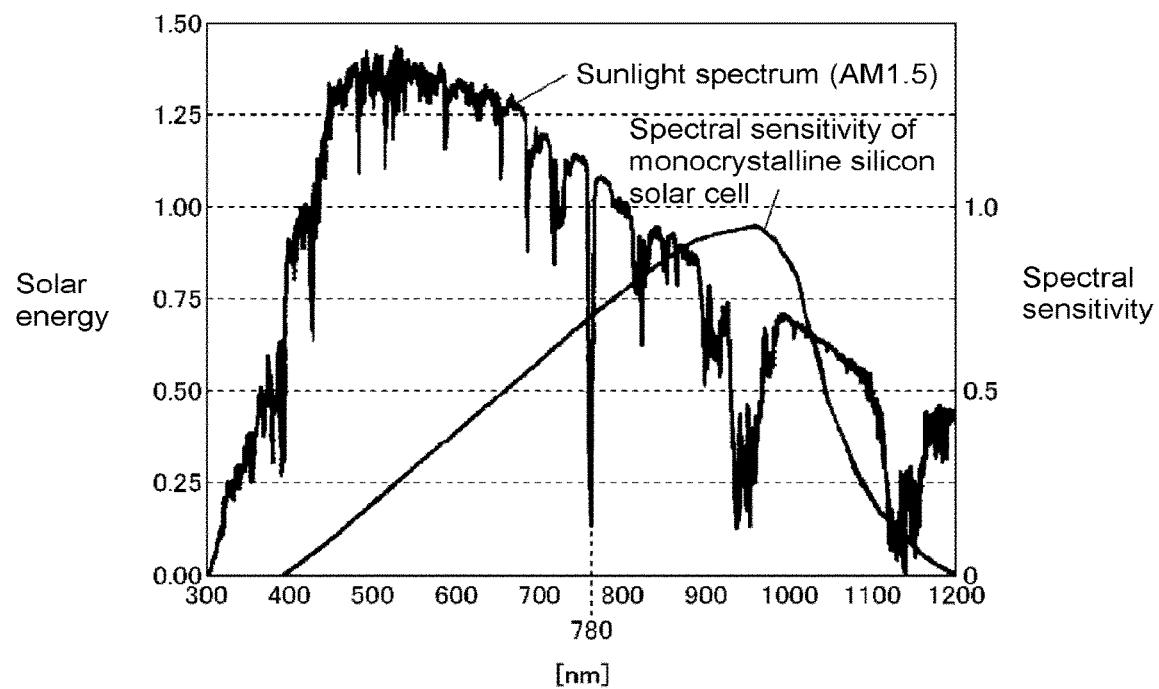
FIG. 3 is a graph illustrating a sunlight spectrum on the ground and a spectral sensitivity curve of a monocrystalline silicon solar cell.

FIG. 3 is a graph illustrating a sunlight spectrum (solar energy) on the ground and a spectral sensitivity curve of a monocrystalline silicon solar cell.

As evident from FIG. 3, the monocrystalline silicon solar cell has a high sensitivity in a region at a wavelength of longer than 780 nm, for example, in a region at a wavelength of at most 1,500 nm (not shown). This means that the present cover glass having a high transmittance in a long wavelength region has significant influence over the power generation efficiency of the monocrystalline silicon solar cell as compared with a conventional transparent cover glass.

That is, according to the solar cell module comprising the present cover glass having an average infrared transmittance of from 20% to 100% in an infrared region at a wavelength of from 780 nm to 1,500 nm, the power generation efficiency can be sufficiently maintained.

For the solar cells in the present invention, in addition to monocrystalline silicon, polycrystalline silicon or a material having sensitivity in an infrared region such as GaAs, CIS, CIGS, CdTe, InP, $Zn_3P_2$ or $Cu_2S$ may be used.

The solar cells in the present invention are preferably CIGS solar cells. When the present cover glass is used, the temperature of the solar cell module tends to be high as compared with a case where a transparent and colorless cover glass is used. Accordingly, by using CIGS solar cells of which the power generation efficiency hardly decreases even when the temperature is high, a solar cell module more excellent in the durability can be obtained.

The solar cell module of the present invention may have a back glass or back sheet, and particularly preferably has a back glass. The back glass and the back sheet are used as disposed on the opposite side from a light-receiving surface of the solar cells in a single-sided light-receiving type solar cell module, in order to improve the strength and the light resistance of the solar cell module. As the back glass or back sheet, an optional organic material or inorganic material may be used, specifically, a glass plate or a resin formed product may be mentioned, which may further have another layer on at least one surface thereof.

For the glass plate in the back glass, the same material as the glass plate in the present invention may be mentioned. The resin formed product in the back sheet may be a resin (such as a fluororesin, an alkyd resin, an amino alkyd resin, a polyester resin, an epoxy resin, a urethane resin, an epoxy polyester resin, a vinyl acetate resin, a (meth)acrylic resin, a vinyl chloride resin, a phenol resin, a modified polyester resin, an acrylic silicone resin or a silicone resin) formed into e.g. a plate or a film may be mentioned.

The back glass and the back sheet preferably has, in view of the design and the power generation efficiency of the solar cell module of the present invention, a low total transmittance, specifically from 0% to 30%.

In the present solar cell module, the absolute value *Lb of a difference of the *L value between the solar cell and the back glass or back sheet is, in view of the design of the present solar cell module, preferably from 0 to 5, more preferably from 0 to 3. *Lb may be optionally adjusted by using a back glass or back sheet containing e.g. a pigment, or by using a back glass or back sheet having a layer containing e.g. a pigment.

The present solar cell module preferably has no wiring between the solar cells or if so, the wiring is preferably black or has the same color as the solar cells, in view of the design of the present solar cell module. In such a case, the wiring may be colored by a known method.

Now, the present invention will be described in further detail with reference to Examples and Comparative Examples and Tables 1 to 6, however, the present invention is by no means restricted thereto.

Ex. 1 to 38 and 41 to 55 are Examples of the present invention, and Ex. 39 and 40 are Comparative Examples.

The cover glass for a solar cell module in each of Ex. 1 to 26 is a cover glass consisting of a phase-separated glass plate containing a coloring component element. The cover glass for a solar cell module in each of Ex. 27 to 34 is a cover glass consisting of a glass plate containing a coloring component element. The cover glass for a solar cell module in each of Ex. 35 and 36 is a cover glass having a coating layer obtained by applying a coating material containing an organic pigment on one surface of a soda lime glass plate (in Table 4, the coloring source is represented as "organic coating material"). The cover glass for a solar cell module in Ex. 37 is a cover glass having a coating layer obtained by applying a coating material containing an inorganic pigment on one surface of a soda lime glass plate (in Table 2, the coloring source is represented as an "inorganic coating material"). The cover glass for a solar cell module in Ex. 38 is a cover glass comprising a crystallized glass plate.

The cover glass for a solar cell module in Ex. 39 consists of a soda lime glass plate, does not contain a coloring component element, is not crystallized glass nor phase-separated glass, and has no coating material applied to the surface of the glass plate. The cover glass for a solar cell module in Ex. 40 comprises the cover glass in Ex. 39 and has its surface coated with Al to constitute a mirror.

The cover glass for a solar cell module in each of Ex. 41 to 55 is a cover glass comprising a soda lime glass plate and a coating layer obtained by applying a coating material containing an inorganic pigment to one surface of the soda lime glass plate (in Table 5, the coloring source is represented as "inorganic coating material"), and as the inorganic pigment, the pigment as identified in Table 5 or 6 is used. As the coating material, a fluorinated coating material is used in Ex. 41 to 53, a silicone-based coating material is used in Ex. 54, and a glass frit dispersion is used in Ex. 55. The refractive index of the glass plate in each of Ex. 41 to 55 is 1.52, and the refractive index of the coating layer in each Ex. is from 1.40 to 1.65.

The coating layer thickness is a value measured by using an eddy-current instrument for measuring thickness (tradename "EDY-5000", manufactured by SANKO ELECTRONIC LABORATORY CO., LTD.), and the glass plate thickness is a value measured by using a thickness meter (micrometer).

The glass plate in the cover glass in each of Ex. 1 to 26 is chemically tempered, and the glass plate in the cover glass in Ex. 35 to 37 is physically tempered.

Of the cover glass in each of Ex. 1 to 55, the visible transmittance, the average infrared transmittance, the visible reflectance, the average infrared diffuse transmittance, the dominant wavelength, the complementary wavelength, the excitation purity, L*, a*, b*, the glass plate thickness and the coating layer thickness were obtained respectively by the above methods.

Further, the power generation efficiency when the cover glass in each of Ex. 1 to 55 is used for a solar cell module, based on the power generation efficiency of a monocrystalline silicon cell having no cover glass being 100%, was obtained as follows.

Taking the power generation contribution degrees in the visible region (from 380 nm to 780 nm) and the infrared region (from 780 nm to 1,500 nm) of monocrystalline silicon being 30% and 70%, respectively, the visible transmittance and the average infrared transmittance were multiplied and added, to calculate the power generation efficiency of a monocrystalline silicon cell having no cover glass. The results are shown in Tables 1 to 6.

TABLE 1

| | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Coloring source | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element |
| Glass plate tempering method | Chemical tempering | Chemical tempering | Chemical tempering | Chemical tempering | Chemical tempering | Chemical tempering | Chemical tempering | Chemical tempering | Chemical tempering | Chemical tempering |
| Glass plate thickness (mm) | 1.0 | 1.0 | 1.0 | 1.0 | 1.0 | 1.0 | 1.0 | 1.0 | 1.0 | 1.0 |
| Visible transmittance (%) | 27.4 | 17.4 | 21.2 | 10.0 | 17.9 | 18.7 | 25.0 | 47.6 | 47.7 | 26.6 |
| Average infrared transmittance (%) | 80.6 | 60.5 | 77.5 | 57.1 | 68.3 | 71.2 | 38.8 | 55.8 | 55.7 | 27.4 |
| Dominant wavelength (nm) | 476 | | 481 | | 473 | 480 | 472 | 472 | 473 | 476 |
| Complementary wavelength (nm) | | 493 | | 494 | | | | | | |
| Excitation purity | 32.7 | 5.2 | 13.1 | 4.1 | 41.0 | 27.0 | 4.4 | 4.3 | 4.6 | 4.1 |
| L* | 69.2 | 62.0 | 78.1 | 69.0 | 55.8 | 51.6 | 94.5 | 82.3 | 83.0 | 92.5 |
| a* | 2.1 | 8.5 | -3.9 | 6.8 | 8.9 | -3.6 | 1.2 | 1.1 | 1.0 | 0.4 |
| b* | -31.1 | 1.7 | -11.2 | 0.7 | -36.3 | -17.9 | -5.5 | -4.8 | -5.1 | -4.7 |
| Visible reflectance (%) | 36.5 | 31.6 | 51.5 | 40.4 | 21.6 | 18.3 | 85.9 | 60.4 | 61.7 | 81.2 |
| Average infrared diffuse transmittance (%) | 4.5 | 22.4 | 0.0 | 26.4 | 0.0 | 3.0 | 38.8 | 52.0 | 47.8 | 27.4 |
| Power generation efficiency (%) | 64.6 | 47.6 | 60.6 | 43.0 | 53.2 | 55.5 | 34.7 | 53.3 | 53.3 | 27.1 |

TABLE 2

|  | Ex. 11 | Ex. 12 | Ex. 13 | Ex. 14 | Ex. 15 | Ex. 16 | Ex. 17 | Ex. 18 | Ex. 19 | Ex. 20 |
| --- | --- | --- | --- | --- | --- | --- | --- | --- | --- | --- |
| Coloring source | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element | Phase-separated glass, coloring element |
| Glass plate tempering method | Chemical tempering | Chemical tempering | Chemical tempering | Chemical tempering | Chemical tempering | Chemical tempering | Chemical tempering | Chemical tempering | Chemical tempering | Chemical tempering |
| Glass plate thickness (mm) | 1.0 | 1.0 | 1.0 | 1.0 | 1.0 | 1.0 | 1.0 | 1.0 | 1.0 | 1.0 |
| Visible transmittance (%) | 42.1 | 11.6 | 7.7 | 42.8 | 43.1 | 53.4 | 40.9 | 40.6 | 6.5 | 11.6 |
| Average infrared transmittance (%) | 63.8 | 69.2 | 59.1 | 90.5 | 90.5 | 76.5 | 34.8 | 35.3 | 41.2 | 69.3 |
| Dominant wavelength (nm) | 590 | 457 | 450 |  |  |  | 497 | 496 | 477 | 457 |
| Cornplementary wavelength (nm) |  |  |  | 506 | 502 | 541 |  |  |  |  |
| Excitation purity | 6.8 | 16.5 | 8.3 | 5.2 | 5.1 | 1.2 | 6.1 | 6.2 | 4.8 | 16.4 |
| L* | 29.7 | 25.7 | 26.2 | 28.1 | 28.0 | 28.0 | 28.9 | 29.1 | 31.8 | 26.1 |
| a* | 2.3 | 4.5 | 2.4 | 3.5 | 3.6 | 0.6 | -5.6 | -5.5 | 0.0 | 4.6 |
| b* | 2.4 | -8.8 | -4.4 | -0.8 | -0.6 | -0.4 | 0.1 | 0.0 | -2.4 | -8.9 |
| Visible reflectance (%) | 6.3 | 4.6 | 4.8 | 5.6 | 5.6 | 5.5 | 5.6 | 5.7 | 6.9 | 4.7 |
| Average infrared diffuse transmittance (%) | 0.9 | 1.2 | 9.7 | 1.5 | 1.5 | 1.5 | 0.0 | 0.5 | 0.2 | 0.3 |
| Power generation efficiency (%) | 57.3 | 51.9 | 43.6 | 76.2 | 76.3 | 69.5 | 36.6 | 36.9 | 30.8 | 52.0 |

TABLE 3

|  | Ex. 21 | Ex. 22 | Ex. 23 | Ex. 24 | Ex. 25 | Ex. 26 | Ex. 27 | Ex. 28 | Ex. 29 | Ex. 30 |
| --- | --- | --- | --- | --- | --- | --- | --- | --- | --- | --- |
| Coloring source | Phase-separated glass, coloring element | Phase-separated glass, coloring element | Phase-separated glass, coloring element | Phase-separated glass, coloring element | Phase-separated glass, coloring element | Phase-separated glass, coloring element | Coloring element | Coloring element | Coloring element | Coloring element |
| Glass plate tempering method | Chemical tempering | Chemical tempering | Chemical tempering | Chemical tempering | Chemical tempering | Chemical tempering | No tempering | No tempering | No tempering | No tempering |
| Glass plate thickness (mm) | 1.0 | 1.0 | 1.0 | 1.0 | 1.0 | 1.0 | 1.0 | 1.0 | 1.0 | 1.0 |
| Visible transmittance (%) | 41.0 | 22.7 | 53.3 | 29.5 | 8.0 | 1.2 | 0.0 | 0.5 | 0.3 | 3.8 |
| Average infrared transmittance (%) | 63.1 | 67.9 | 76.3 | 41.9 | 60.0 | 50.4 | 35.4 | 50.7 | 79.0 | 84.1 |
| Dominant wavelength (nm) | 590 | 472 |  |  | 464 | 463 | 459 | 459 | 457 | 451 |
| Cornplementary wavelength (nm) |  |  | 566 | 496 |  |  |  |  |  |  |
| Excitation purity | 6.8 | 5.3 | 1.7 | 1.1 | 5.9 | 5.3 | 2.4 | 2.6 | 2.9 | 2.6 |
| L* | 29.8 | 27.2 | 28.2 | 27.1 | 26.4 | 26.4 | 25.6 | 25.3 | 25.6 | 25.3 |
| a* | 2.3 | 0.6 | 0.6 | 0.8 | 1.2 | 1.2 | 0.6 | 0.6 | 0.7 | 0.7 |
| b* | 2.4 | -2.6 | -0.9 | 0.0 | -3.0 | -2.8 | -1.2 | -1.3 | -1.5 | -1.3 |
| Visible reflectance (%) | 6.3 | 5.1 | 5.5 | 5.2 | 4.9 | 4.9 | 4.6 | 4.5 | 4.6 | 4.5 |
| Average infrared diffuse transmittance (%) | 0.0 | 0.0 | 0.0 | 0.0 | 0.2 | 0.0 | 4.3 | 0.1 | 0.2 | 0.0 |
| Power generation efficiency (%) | 56.5 | 54.4 | 69.4 | 38.2 | 44.4 | 35.6 | 24.8 | 35.7 | 55.4 | 60.0 |

TABLE 4

|  | Ex. 31 | Ex. 32 | Ex. 33 | Ex. 34 | Ex. 35 | Ex. 36 | Ex. 37 | Ex. 38 | Ex. 39 | Ex. 40 |
| --- | --- | --- | --- | --- | --- | --- | --- | --- | --- | --- |
| Coloring source | Coloring element | Coloring element | Coloring element | Coloring element | Organic coating material | Organic coating material | Inorganic coating material | Crystallized glass | Nil | Nil |
| Glass plate tempering method | No tempering | No tempering | No tempering | No tempering | Physical tempering | Physical tempering | Physical tempering | No tempering | No tempering | No tempering |
| Glass plate thickness (mm) | 1.0 | 1.0 | 1.0 | 1.0 | 5.0 | 5.0 | 4.0 | 3.3 | 5.0 | 4.0 |

TABLE 4-continued

|  | Ex. 31 | Ex. 32 | Ex. 33 | Ex. 34 | Ex. 35 | Ex. 36 | Ex. 37 | Ex. 38 | Ex. 39 | Ex. 40 |
|---|---|---|---|---|---|---|---|---|---|---|
| Visible transmittance (%) | 5.6 | 15.6 | 18.0 | 32.6 | 1.3 | 0.8 | 10.4 | 42.5 | 91.5 | 0.0 |
| Average infrared transmittance (%) | 66.4 | 74.8 | 88.4 | 89.7 | 20.6 | 21.3 | 21.3 | 39.6 | 89.0 | 0.0 |
| Dominant wavelength (nm) | 463 | 474 |  | 609 | 554 | 625 | 473 | 483 |  |  |
| Complementary wavelength (nm) |  |  | 555 |  |  |  |  |  |  |  |
| Excitation purity | 3.5 | 5.8 | 2.2 | 1.8 | 28.1 | 28.4 | 3.3 | 2.7 |  |  |
| L* | 25.3 | 25.7 | 25.7 | 26.6 | 57.6 | 35.0 | 78.1 | 58.2 |  |  |
| a* | 0.7 | 0.4 | 1.0 | 1.2 | -25.3 | 24.9 | 0.7 | -0.9 |  |  |
| b* | -1.7 | -2.6 | -0.8 | 0.5 | 22.8 | 8.9 | -3.5 | -1.7 |  |  |
| Visible reflectance (%) | 4.5 | 4.6 | 4.7 | 5.0 | 24.4 | 10.1 | 53.1 | 26.0 | 0.1 | 100.0 |
| Average infrared diffuse transmittance (%) | 0.0 | 0.2 | 0.1 | 0.2 | 19.8 | 19.7 | 21.3 | 13.2 | 0.0 | 0.0 |
| Power generation efficiency (%) | 48.2 | 57.0 | 67.3 | 72.6 | 14.8 | 15.2 | 18.0 | 40.4 | 89.8 | 0.0 |

TABLE 5

|  | Ex. 41 | Ex. 42 | Ex. 43 | Ex. 44 | Ex. 45 | Ex. 46 | Ex. 47 |
|---|---|---|---|---|---|---|---|
| Coloring source | Inorganic coating material | Inorganic coating material | Inorganic coating material | Inorganic coating material material | Inorganic coating material | Inorganic coating material | Inorganic coating material |
| Glass plate tempering method | No tempering | No tempering | No tempering | No tempering | No tempering | No tempering | No tempering |
| Glass plate thickness (mm) | 2.8 | 2.8 | 2.8 | 2.8 | 2.8 | 3.2 | 3.2 |
| Coating layer thickness (μm) | 50 | 42 | 51 | 8 | 23 | 46 | 35 |
| Film thickness/plate thickness | 0.018 | 0.015 | 0.018 | 0.003 | 0.008 | 0.014 | 0.011 |
| Pigment contained in coating layer | Lithium cobalt phosphate | Composite oxide of cobalt and aluminum | Composite oxide of nickel, titanium and antimony | Composite oxide of nickel, titanium and antimony | Composite oxide of chromium, titanium and antimony | Composite oxide of cobalt and aluminum | Iron oxide |
| Visible transmittance (%) | 37.9 | 2.4 | 21.5 | 53.4 | 32.5 | 6.0 | 1.7 |
| Average infrared transmittance (%) | 60.4 | 38.8 | 22.0 | 51.6 | 41.9 | 54.6 | 52.6 |
| Dominant wavelength (nm) |  | 469 | 571 | 569 | 577 | 468 | 606 |
| Complementary wavelength (nm) | 558 |  |  |  |  |  |  |
| Excitation purity | 38.7 | 63.3 | 53.0 | 23.3 | 49.9 | 53.5 | 14.5 |
| L* | 37.2 | 35.9 | 88.4 | 56.9 | 54.9 | 29.5 | 30.5 |
| a* | 27.9 | 22.4 | -15.6 | -7.3 | -0.3 | 14.8 | 9.1 |
| b* | -22.9 | -49.3 | 54.3 | 16.7 | 33.2 | -34.3 | 4.5 |
| Visible reflectance (%) | 10.3 | 7.5 | 21.5 | 25.1 | 24.4 | 6.7 | 20.3 |
| Average infrared diffuse transmittance (%) | 60.1 | 25.2 | 22.0 | 50.0 | 41.8 | 28.4 | 50.7 |
| Power generation efficiency (%) | 53.6 | 27.9 | 21.9 | 52.1 | 39.1 | 40.0 | 37.4 |

TABLE 6

|  | Ex. 48 | Ex. 49 | Ex. 50 | Ex. 51 | Ex. 52 | Ex. 53 | Ex. 54 | Ex. 55 |
|---|---|---|---|---|---|---|---|---|
| Coloring source | Inorganic coating material | Inorganic coating material | Inorganic coating material | Inorganic coating material | Inorganic coating material | Inorganic coating material | Inorganic coating material | Inorganic coating material |
| Glass plate tempering method | No tempering | No tempering | No tempering | No tempering | No tempering | No tempering | No tempering | No tempering |

TABLE 6-continued

| | Ex. 48 | Ex. 49 | Ex. 50 | Ex. 51 | Ex. 52 | Ex. 53 | Ex. 54 | Ex. 55 |
|---|---|---|---|---|---|---|---|---|
| Glass plate thickness (mm) | 3.2 | 3.2 | 3.2 | 3.2 | 3.2 | 3.2 | 5.0 | 3.0 |
| Coating layer thickness (μm) | 43 | 43 | 48 | 43 | 43 | 48 | 60 | 50 |
| Film thickness/plate thickness | 0.013 | 0.013 | 0.015 | 0.013 | 0.013 | 0.015 | 0.012 | 0.017 |
| Pigment contained in coating layer | Yellow iron sesquioxide | Iron oxide | Composite oxide of cobalt and aluminum | Composite oxide of cobalt and aluminum, and titanium oxide | Composite oxide of cobalt and aluminum, and zirconium oxide | Zirconium oxide | Composite oxide of cobalt and aluminum | Composite oxide of cobalt and aluminum |
| Visible transmittance (%) | 39.6 | 3.6 | 7.2 | 1.8 | 5.9 | 41.9 | 7.8 | 16.4 |
| Average infrared transmittance (%) | 86.0 | 70.7 | 58.9 | 43.5 | 52.5 | 59.2 | 44.0 | 67.0 |
| Dominant wavelength (nm) | 587 | 597 | 467 | 471 | 469 | 476 | 469 | 469 |
| Complementary wavelength (nm) | | | | | | | | |
| Excitation purity | 19.0 | 12.1 | 53.6 | 66.3 | 59.5 | 13.7 | 52.2 | 55.3 |
| L* | 34.3 | 28.6 | 29.4 | 42.6 | 32.0 | 72.5 | 32.1 | 27.0 |
| a* | 4.8 | 5.6 | 16.1 | 21.5 | 18.5 | 1.1 | 14.8 | 13.7 |
| b* | 7.9 | 3.9 | −34.9 | −56.8 | −41.7 | −13.1 | −35.1 | −33.5 |
| Visible reflectance (%) | 9.1 | 11.9 | 6.7 | 10.3 | 8.0 | 23.0 | 11.9 | 6.2 |
| Average infrared diffuse transmittance (%) | 30.5 | 57.0 | 9.3 | 18.3 | 38.5 | 57.6 | 43.3 | 59.6 |
| Power generation efficiency (%) | 72.1 | 50.5 | 43.4 | 31.0 | 38.5 | 54.0 | 33.1 | 51.8 |

The cover glass for a solar cell module in each of Ex. 1 to 38 and 41 to 55 has a visible transmittance of from 0% to 60%, and an average infrared transmittance in an infrared region at a wavelength of from 780 nm to 1,500 nm of from 20% to 100%, and accordingly the power generation efficiency of the solar cell module can be sufficiently maintained even when a design is imparted to the entire surface of the cover glass so as to make the solar cells be invisible from the outside.

The cover glass for a solar cell module in Ex. 39 does not contain a coloring component element, is not crystallized glass nor phase-separated glass, and has no coating material applied to the surface, and thereby has a visible transmittance of higher than 60%. Accordingly, in the solar cell module using the cover glass in Ex. 39, the solar cells were observed through the cover glass, and the solar cell module had no design.

The cover glass for a solar cell module in Ex. 40 had an average infrared transmittance of 0%, which was less than 20%. Accordingly, by the solar cell module using the cover glass in Ex. 40, power generation could not be conducted.

This application is a continuation of PCT Application No. PCT/JP2018/019791, filed on May 23, 2018, which is based upon and claims the benefit of priority from Japanese Patent Application No. 2017-101857 filed on May 23, 2017. The contents of those applications are incorporated herein by reference in their entireties.

REFERENCE SYMBOLS

10: solar cell module, 12: solar cell array, 14: cover glass for solar cell, 16: solar cell, 18: encapsulant material

What is claimed is:

1. A solar cell module, which is adapted for installation on a wall or window, comprising a cover glass and solar cells,
   wherein the cover glass is bonded to at least one light-receiving surface of the solar cells via an encapsulant material,
   wherein the cover glass comprises a glass plate and a single coating layer of a thickness from 5 μm to 2,000 μm, the single coating layer being formed by applying a coating material consisting of a coating resin, optionally a solvent, and at least one member selected from the group consisting of an organic pigment, a dye and an inorganic pigment to the front surface, the rear surface or both the front and rear surfaces of the glass plate, with the proviso that the organic pigment, the dye and the inorganic pigment is not black,
   wherein the single coating layer comprises the organic pigment, the dye and/or the inorganic pigment in the entire layer applied to the front surface, the rear surface or both the surfaces of the glass plate; and
   wherein the cover glass has a visible transmittance of from 0% to 60%, and an average infrared transmittance of from 20% to 100%, which is a value calculated by averaging transmittances at 5 nm intervals in an infrared region at a wavelength of from 780 to 1,500 nm.

2. The solar cell module according to claim 1, wherein the cover glass reflects light such that reflected light has a dominant wavelength of from 380 nm to 780 nm or a complementary wavelength of from 490 nm to 570 nm, and an excitation purity of from 1% to 100%.

3. The solar cell module according to claim 1, wherein the cover glass reflects light such that reflected light has in the L*a*b* color space an L* value of from 5 to 100, an a* value of from −60 to 60, and a b* value of from −60 to 60.

4. The solar cell module according to claim 1, wherein the cover glass comprises at least one element selected from the group consisting of Co, Mn, Fe, Ni, Cu, Cr, V, Zn, Bi, Er, Tm, Nd, Sm, Sn, Ce, Pr, Eu, Ag and Au.

5. The solar cell module according to claim 1, wherein the ratio of the coating layer thickness to the glass plate thickness is from 0.001 to 1.0.

6. The solar cell module according to claim 1, wherein the glass plate has a refractive index of from 1.40 to 1.90, and the coating layer has a refractive index of from 1.30 to 1.80.

7. The solar cell module according to claim 1, wherein the cover glass scatters infrared light having a wavelength of from 780 nm to 1,500 nm.

8. The solar cell module according to claim 1, wherein the glass plate consists of crystallized glass.

9. The solar cell module according to claim 1, wherein the glass plate consists of phase-separated glass.

10. The solar cell module according to claim 1, wherein the solar cells have a power generation peak in an infrared region at a wavelength of from 780 nm to 1,500 nm.

11. The solar cell module according to claim 1, which has a power generation peak in an infrared region at a wavelength of from 780 nm to 1,500 nm.

12. The solar cell module according to claim 1, wherein the solar cells are monocrystalline silicon, polycrystalline silicon, GaAs, CIS, CIGS, CdTe, InP, Zn3P2 or Cu2S solar cells.

13. The solar cell module according to claim 1, further comprising a back glass on an opposite side from a light-receiving surface of the solar cell module.

14. The solar cell module according to claim 1, further comprising a back sheet on an opposite side from a light-receiving surface of the solar cell module.

15. The solar cell module according to claim 1, wherein the cover glass has a visible transmittance of from 0% to 50%, and an average infrared transmittance of from 40% to 100%, which is a value calculated by averaging transmittances at 5 nm intervals in an infrared region at a wavelength of from 780 to 1,500 nm.

16. The solar cell module according to claim 1, wherein the cover glass has a visible transmittance of from 0% to 30%, and an average infrared transmittance of from 60% to 100%, which is a value calculated by averaging transmittances at 5 nm intervals in an infrared region at a wavelength of from 780 to 1,500 nm.

17. A wall of a building, comprising the solar cell module according to claim 1.

18. A window of a building, comprising the solar cell module according to claim 1.

* * * * *